(12) United States Patent
Lin (10) Patent No.: US 12,156,335 B2
(45) Date of Patent: Nov. 26, 2024

(54) ELECTRONIC DEVICE

(71) Applicant: Hung-Yu Lin, New Taipei (TW)

(72) Inventor: Hung-Yu Lin, New Taipei (TW)

( * ) Notice: Subject to any disclaimer, the term of this patent is extended or adjusted under 35 U.S.C. 154(b) by 113 days.

(21) Appl. No.: 17/820,410

(22) Filed: Aug. 17, 2022

(65) Prior Publication Data

US 2023/0055016 A1 Feb. 23, 2023

(30) Foreign Application Priority Data

Aug. 17, 2021 (TW) .................................. 110130282

(51) Int. Cl.
*H05K 1/18* (2006.01)
*F21V 19/00* (2006.01)
*H01L 25/075* (2006.01)
*F21Y 115/10* (2016.01)

(52) U.S. Cl.
CPC ......... *H05K 1/181* (2013.01); *F21V 19/0025* (2013.01); *H01L 25/0753* (2013.01); *F21Y 2115/10* (2016.08); *H05K 2201/10106* (2013.01)

(58) Field of Classification Search
CPC ......... H05K 1/181; H05K 2201/10106; H05K 3/3447; H05K 2201/09045; H05K 2201/10901; H05K 2201/10303; F21V 19/0025; H01L 25/0753; F21Y 2115/10; F21Y 2107/50
See application file for complete search history.

(56) References Cited

U.S. PATENT DOCUMENTS

| | | | | |
|---|---|---|---|---|
| 2005/0286259 A1* | 12/2005 | Wang | ...................... | F21S 43/14 362/545 |
| 2009/0141468 A1* | 6/2009 | Yang | ...................... | H05K 3/301 361/807 |
| 2018/0095540 A1* | 4/2018 | Terao | ..................... | G06F 3/0304 |
| 2018/0266669 A1* | 9/2018 | Mochizuki | .............. | F21V 14/02 |

* cited by examiner

*Primary Examiner* — Elmito Breval
(74) *Attorney, Agent, or Firm* — HSML P. C.

(57) ABSTRACT

An electronic device is provided and includes a bearing member defined with a bearing surface, and at least one electronic element disposed on the bearing member, where the electronic element is disposed on the bearing member in a manner that can be inclined relative to the bearing surface, such that when the electronic element is a light-emitting element, the light presented by the electronic element can effectively illuminate a predetermined area.

18 Claims, 8 Drawing Sheets

ELECTRONIC DEVICE

BACKGROUND

1. Technical Field

The present disclosure relates to an electronic device, and more particularly, to an electronic device suitable for disposing electronic elements in an inclined manner.

2. Description of Related Art

In recent years, light-emitting diodes (LED) have developed rapidly, and have gradually replaced traditional tungsten lamps, incandescent lamps, fluorescent lamps and magnesium lamps and other lighting fixtures. The main reason is that LEDs have low power consumption, and LEDs have better effects on brightness, color and switching speed, so they can be fully effective when applied to indoor or outdoor lighting or traffic signs that provide guidance.

Figure 1:
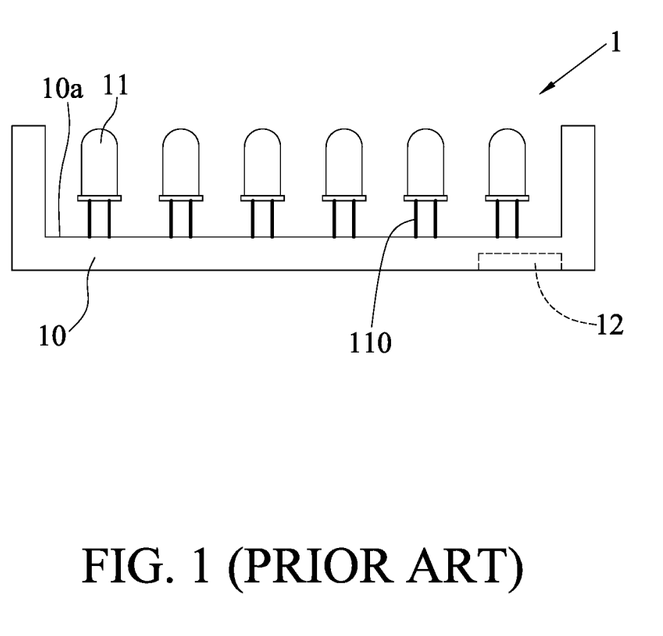
FIG. 1 is a schematic side view of a conventional light-emitting device.

FIG. 1 is a schematic side view of a conventional light-emitting device 1. As shown in FIG. 1, the light-emitting device 1 includes: a circuit board 10, a plurality of light-emitting diodes (LEDs) 11 and a battery 12. The circuit board 10 has a bearing surface 10a for mounting the light-emitting diodes 11. The light-emitting diodes 11 are erected or vertically disposed on the bearing surface 10a relative to the bearing surface 10a. The battery 12 is electrically connected to the light-emitting diodes 11.

However, when assembling the conventional light-emitting device 1, each of the light-emitting diodes 11 needs to be inserted into the circuit board 10 with its electrode pins 110. Therefore, if the light-emitting diodes 11 are manually inserted one by one, the heights of the light-emitting diodes 11 are difficult to be consistent, resulting in uneven light displayed by the light-emitting device 1.

Furthermore, the light-emitting diodes 11 can also be inserted by an automated machine. However, whether the light-emitting diodes 11 are inserted manually or by an automated machine, the electrode pins 110 are easily bent. Therefore, when the light-emitting diodes 11 are inserted, the light-emitting diodes 11 are easily inclined arbitrarily due to uneven force, resulting in inconsistent heights of the light-emitting diodes 11, thereby causing the light displayed by the light-emitting device 1 to be non-uniform.

In addition, each of the light-emitting diodes 11 is vertically inserted into the circuit board 10, so its light-emitting angle is limited. Therefore, it is difficult for the light presented by the light-emitting diodes 11 to effectively illuminate certain predetermined areas.

Therefore, how to overcome the above-mentioned various drawbacks of the prior art has become an urgent problem to be solved at present.

SUMMARY

In light of the various deficiencies of the prior art, the present disclosure provides an electronic device, comprising: a bearing member defined with a bearing surface; and at least one electronic element disposed on the bearing member in an inclined manner relative to the bearing surface.

In the aforementioned electronic device, the bearing member includes a circuit board and a plurality of guide bases, wherein one surface of the circuit board is defined as the bearing surface, and the plurality of guide bases are disposed on the bearing surface, and wherein each of the guide bases has a mounting surface inclined relative to the bearing surface, and the electronic element is disposed on the guide base and abuts against the mounting surface, such that the electronic element is obliquely disposed on the bearing member relative to the bearing surface.

For example, each of the guide bases is in a shape of a hill or a triangle protruding block, such that at least one inclined surface thereof is used as the mounting surface. Alternatively, each of the guide bases is formed with a plurality of guide holes communicating with the circuit board, and wherein the plurality of guide holes extend from the mounting surface to the other surface of the circuit board opposite to the bearing surface. For example, each of the guide holes can be tapered from the mounting surface toward the other surface of the circuit board relative to the bearing surface at a port corresponding to the mounting surface. Or, the electronic element has a plurality of electrode pins passing through the guide base, such that the electronic element is electrically connected to the circuit board. Further, the plurality of electrode pins further pass through the circuit board, such that the plurality of electrode pins are electrically connected to the electronic element and the bearing member via a solder. Furthermore, the electronic element has a positioning portion corresponding to the mounting surface, and the positioning portion abuts against the mounting surface.

In the aforementioned electronic device, the electronic element is a light-emitting element.

In the aforementioned electronic device, the electronic device further comprises a power source electrically connected to the electronic element.

In the aforementioned electronic device, the bearing member includes a base, a driving group disposed on the base and a support structure disposed on the driving group, wherein one of surfaces of the base is defined as the bearing surface, and the electronic element is disposed on the support structure, and wherein the driving group is disposed on the bearing surface, and the driving group drives the support structure to displace, such that the electronic element is inclined relative to the bearing surface.

For example, the driving group includes at least one motor for actuating the support structure. Alternatively, the driving group is used for swinging the support structure. Or, the driving group moves the support structure in a biaxial displacement manner. Further, the support structure includes at least one circuit board on which the electronic element is disposed, such that the driving group is used to displace the circuit board.

In the aforementioned electronic device, the bearing member includes a base and a support structure disposed on the base, wherein one of surfaces of the base is defined as the bearing surface, wherein the support structure is disposed on the bearing surface, and the electronic element is disposed on the support structure, and wherein the support structure is disposed on the base in a manner that is rotatable relative to the bearing surface, such that the electronic element is inclined relative to the bearing surface.

For example, the support structure engages the bearing surface of the bearing member in an engaging manner. Further, the support structure is a gear, and a rack for engaging the gear is formed on the bearing surface.

Alternatively, the bearing member further includes a driving group for driving the base to displace. Further, the driving group displaces the base by electromagnetic induction. For example, the driving group includes a coil group surrounding the surfaces of the base and at least one magnet embedded in the base, and wherein the magnet induces the coil group to displace the base.

As can be seen from the above, in the electronic device of the present disclosure, the electronic elements are positioned by a variety of ways, so as to make the inclination states of the electronic elements consistent without damaging the electrode pins of the electronic elements. Therefore, compared with the prior art, if the electronic device of the present disclosure is applied to a light-emitting product (i.e., the electronic element is a light-emitting element such as an LED), the light it presents will illuminate the area accurately and have a very uniform intensity.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "upper," "lower," "left," "right," "bottom," "one," "a," "an" and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

Figure 2A:
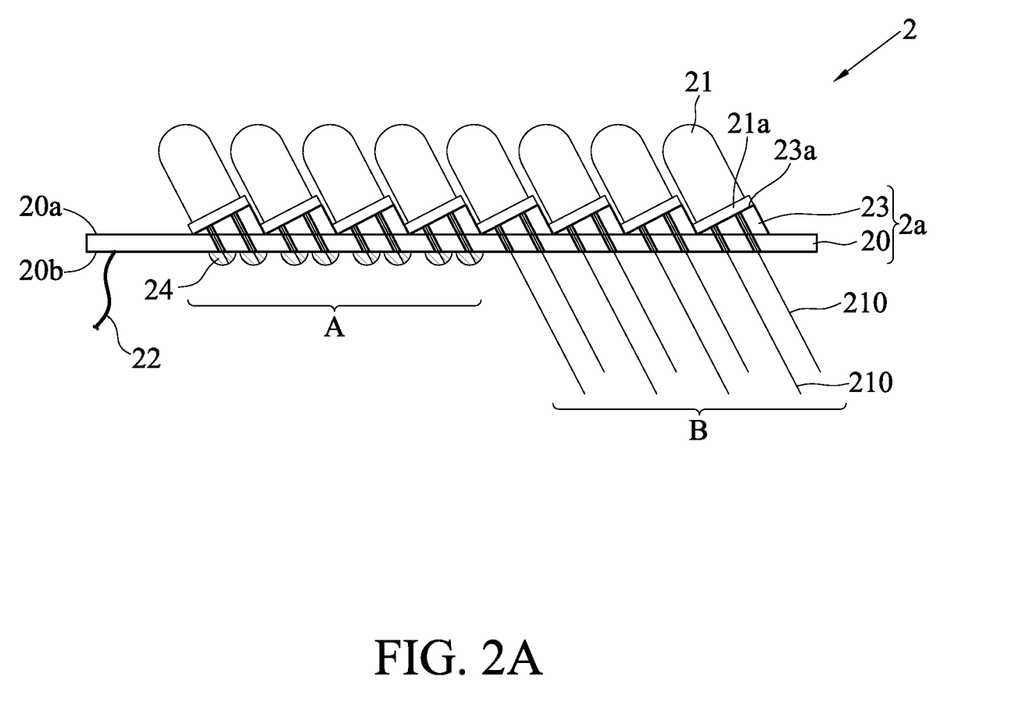
FIG. 2A is a schematic side view of an electronic device according to a first embodiment the present disclosure.
Figure 2B:
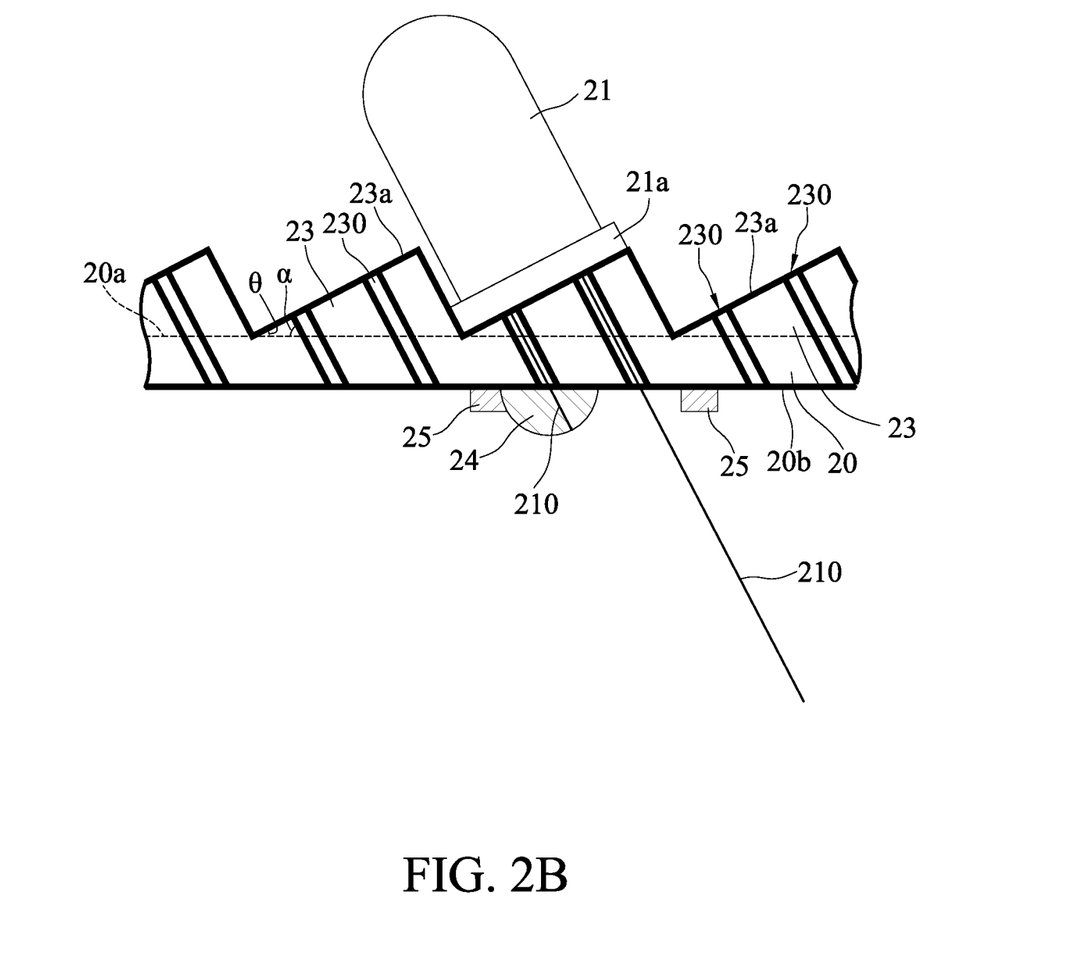
FIG. 2B is a schematic partial enlarged side view of FIG. 2A during the assembly process.

FIG. 2A and FIG. 2B are schematic views of an electronic device 2 according to a first embodiment the present disclosure. As shown in FIG. 2A and FIG. 2B, the electronic device 2 includes a bearing member 2a, a plurality of electronic elements 21, and a power source 22 electrically connected to the electronic elements 21.

The bearing member 2a includes a circuit board 20 and a plurality of guide bases 23. One surface (such as a top surface) of the circuit board 20 is defined as a bearing surface 20a, and the guide bases 23 are disposed or erected on the bearing surface 20a, wherein each of the guide bases 23 has a mounting surface 23a inclined relative to the bearing surface 20a.

In an embodiment, the circuit board 20 has a bottom surface 20b (or the interior of the circuit board 20) opposite to the bearing surface 20a, and the bottom surface 20b is configured with patterned circuits 25 made of copper foil (or other suitable conductive materials), such as copper rails.

Furthermore, each of the guide bases 23 is in the shape of a hill, a triangle, or a protruding block with an inclined surface, so that at least one inclined surface thereof is used as the mounting surface 23a. For example, each of the guide bases 23 is made of a material different from the material of the circuit board 20, such as ABS resin (i.e., acrylonitrile butadiene styrene copolymer or acrylonitrile butadiene styrene), and each of the mounting surfaces 23a of the guide bases 23 is inclined in the same direction. In addition, an inclination angle θ of each mounting surface 23a relative to the bearing surface 20a is the same, which is about 0° to 90°, preferably 50° to 70°. Alternatively, the guide bases 23 can be made of alumina material, which has better hardness. It should be understood that the guide bases 23 can also be made of the same material as that of the circuit board 20, so that the two are integrally formed.

In addition, the bearing member 2a is formed with a plurality of guide holes 230 that communicate with the circuit board 20 and the guide bases 23, so that the guide holes 230 extend obliquely from the mounting surfaces 23a to the bottom surface 20b of the circuit board 20, such that the guide holes 230 are inclined relative to the bearing surface 20a. For example, the inclination direction of the mounting surface 23a and the inclination direction of each of the guide holes 230 are different (e.g., opposite), and an inclination angle α of each of the guide holes 230 relative to the bearing surface 20a and the inclination angle θ of the mounting surface 23a relative to the bearing surface 20a are complementary to each other. It should be understood that the design of the guide holes 230 and the mounting surfaces 23a can be determined according to requirements, and the present disclosure is not limited to as such.

In addition, the bearing member 2a is provided with two guide holes 230 corresponding to a single guide base 23, but the number of the guide holes 230 on the single guide base 23 can be increased or decreased according to requirements.

The electronic element 21 is disposed on the guide base 23 and abuts against the mounting surface 23a, so that the electronic element 21 is disposed on the bearing member 2a obliquely relative to the bearing surface 20a.

In one embodiment, the electronic element 21 has a plurality of electrode pins 210 to pass through the guide base 23 and electrically connect to the internal circuit of the circuit board 20. For example, each of the electronic elements 21 is a capacitor, an inductor, a resistor, a light-emitting diode (LED), or other element suitable for circuit board. The electronic element 21 has two electrode pins 210, and the two electrode pins 210 of the electronic element 21 are respectively inserted through the two guide holes 230 on the guide base 23, such that the two electrode pins 210 protrude from the bottom surface 20b of the circuit board 20.

Furthermore, the electrode pins 210 protrude out of the bottom surface 20b of the circuit board 20, so that the bottom surface 20b of the circuit board 20 is used as a soldering surface. Therefore, the electrode pins 210 and the patterned circuits 25 can be soldered on the bottom surface 20b of the circuit board 20 via a solder 24, so that the electronic element 21 is electrically connected to the bearing member 2a. For example, the electronic elements 21 can be connected in series or in parallel on the bearing member 2a by means of the solder 24, so that the electronic device 2 can be used in various electrical applications according to the requirements of the back-end products. It should be understood that during the manufacturing process, if the solder 24 has soldered the electrode pins 210 and the patterned circuits 25, then the part of the electrode pin 210 protruding from the solder 24 is removed (e.g., a finished area A as shown in FIG. 2A), wherein an unfinished area B shown in FIG. 2A refers to the electrode pins 210 that are not yet soldered.

In addition, each of the electronic elements 21 has a positioning portion 21a, such as a base body (e.g., a seat body) or a ring body, which corresponds to the mounting surface 23a and abuts against the mounting surface 23a. For example, the electrode pin 210 is erected or vertically disposed on the positioning portion 21a, so that when the electrode pin 210 passes through the guide hole 230, the positioning portion 21a abuts against the mounting surface 23a to prevent the electrode pin 210 from continuing to move, so that the electronic element 21 is positioned on the guide base 23.

Figure 2C:
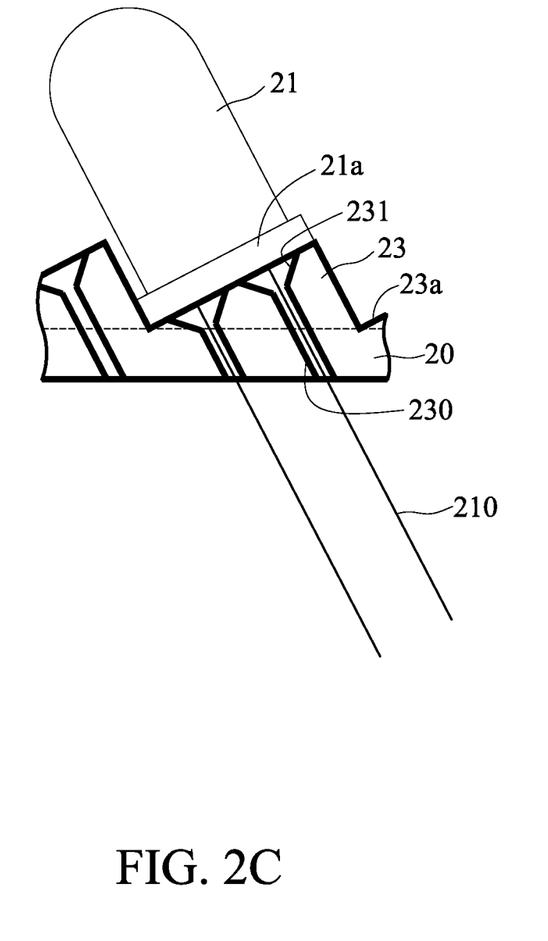
FIG. 2C is a schematic partial enlarged side view of another aspect of FIG. 2A.

In addition, as shown in FIG. 2C, the guide hole 230 can be tapered from the mounting surface 23a toward the bottom surface 20b of the circuit board 20 at a port 231 corresponding to the mounting surface 23a, so as to be a taper, so that it is beneficial for the electrode pin 210 to pass through the guide hole 230 from the port 231 without being damaged.

The power source 22 is, for example, a wire (or a battery) for delivering power to the circuit board 20 to supply power to the electronic elements 21.

Therefore, when assembling the electronic device 2, it is only necessary to insert the electronic element 21 with its electrode pins 210 through the guide holes 230, so that the electronic element 21 abuts against the mounting surface 23a of the guide base 23, such that the electronic element 21 can be arranged on the bearing member 2a obliquely. Therefore, a plurality of electronic elements 21 can be obliquely inserted onto the bearing member 2a at the same time by an automated machine, and there is no need to manually insert the electronic elements 21 one by one.

Furthermore, due to the configuration of the guide holes 230, when the electronic element 21 is inserted, the electrode pins 210 will not collide with the bearing member 2a, so that the electrode pins 210 will not be inclined arbitrarily due to uneven force. In addition, by the design of the positioning portions 21a, the completion of the installation of the electronic elements 21 can be further ensured, so that an inclination state of each of the electronic elements 21 can be ensured to be consistent.

The electronic device 2 of the present disclosure uses the design of the guide bases 23 to facilitate the assembly of the electronic elements 21, and to make the inclination state of each of the electronic elements 21 consistent. Therefore, if the electronic device 2 is applied to a light-emitting product (i.e., the electronic element 21 is a light-emitting element such as an LED), the light presented by the electronic device 2 is very uniform.

Figure 3:
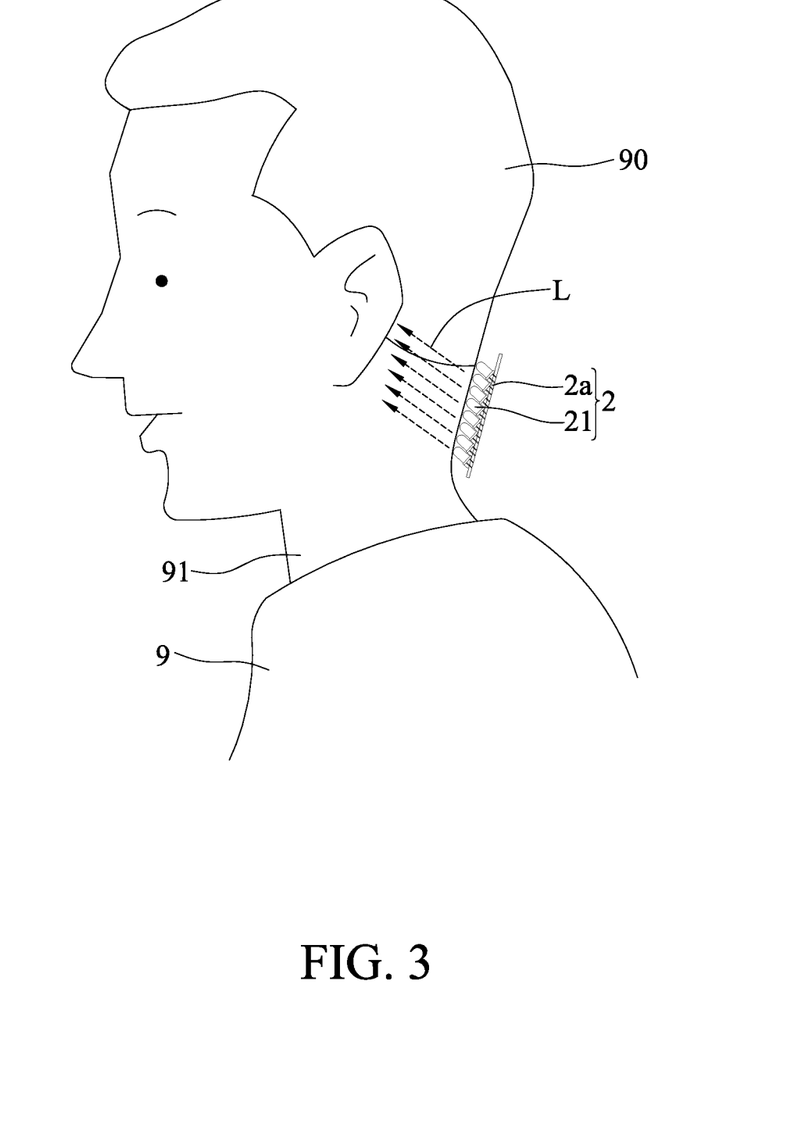
FIG. 3 is a schematic view showing a use state of the electronic device according to the first embodiment the present disclosure.

When using the electronic device 2, taking the electronic element 21 as a light-emitting diode (LED) as an example, as shown in FIG. 3, a user 9 suffering from Parkinson's disease (PD) closes the bearing member 2a to the area at the lower back part of a head 90 and next to a neck 91 of the user 9, so that light L (especially infrared or visible red light) can enter the brain.

Therefore, in the electronic device 2 of the present disclosure, the electronic element 21 is inclined relative to the bearing surface 20a, so that when the bearing member 2a is disposed at the area at the lower back part of the head 90 and next to the neck 91, it is favorable for the light L of the electronic element 21 to enter the midbrain region of the brain through the foramen magnum. Although the entering amount is weak, it can still stimulate the secretory neurons of the substantia nigra in the brain to secrete dopamine, so it can improve the physical function of the user 9.

Figure 4A:
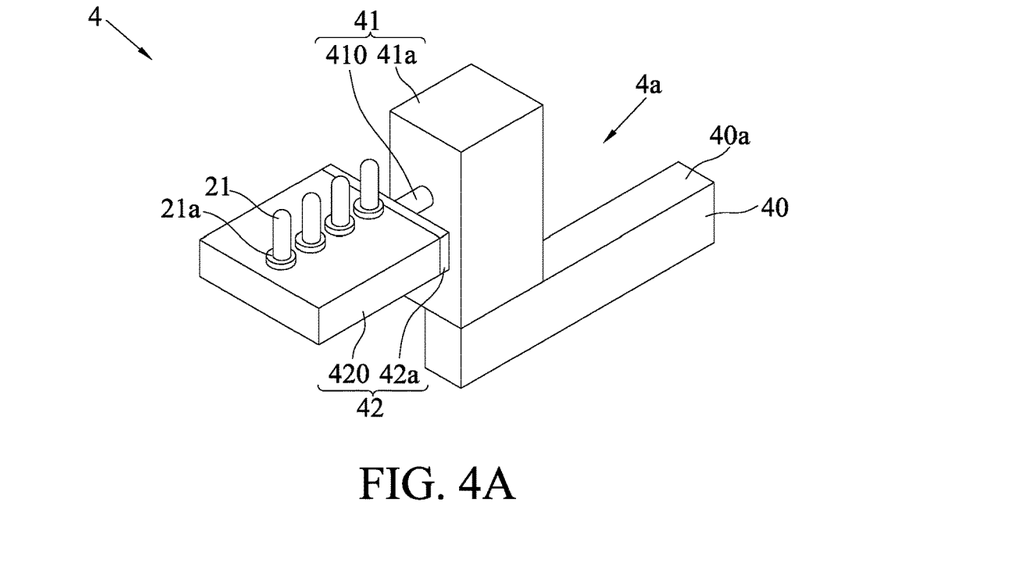
FIG. 4A is a schematic side view of an electronic device according to a second embodiment of the present disclosure.
Figure 4B:
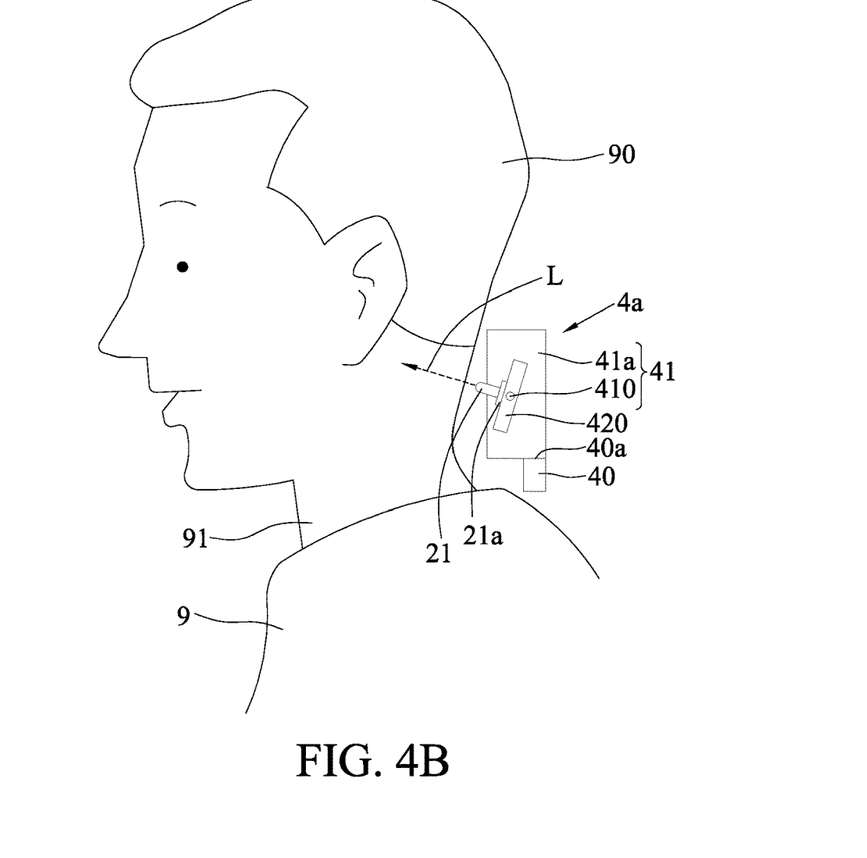
FIG. 4B is a schematic view showing a use state of FIG. 4A.

FIG. 4A and FIG. 4B are schematic views of an electronic device 4 according to a second embodiment of the present disclosure. The difference between the second embodiment and the first embodiment lies in the design of the bearing member, so the same points will not be repeated below.

As shown in FIG. 4A and FIG. 4B, a bearing member 4a includes a base 40, a driving group 41 disposed on the base 40, and a support structure 42 disposed on the driving group 41. One of the surfaces (such as the top surface) of the base 40 is defined as a bearing surface 40a, and the electronic elements 21 are disposed on the support structure 42, wherein the driving group 41 is disposed on the bearing surface 40a, so that the driving group 41 drives the support structure 42 to displace, such that the electronic elements 21 are inclined relative to the bearing surface 40a.

In an embodiment, the driving group 41 includes at least a motor 41a for actuating the support structure 42 and a rotating shaft 410 for linking the motor 41a.

Furthermore, the support structure 42 includes at least one circuit board 420 on which the electronic elements 21 are disposed, so that the driving group 41 is driven to displace the circuit board 420, and the electronic elements 21 are disposed on the circuit board 420. For example, the circuit board 420 is connected to the driving group 41 via a bracket 42a, and the bracket 42a is fastened to an end of the rotating shaft 410, so that when the motor 41a rotates the rotating shaft 410, the bracket 42a rotates together, such that the circuit board 420 and the electronic elements 21 thereon rotate together. Therefore, by adjusting the rotation range of the rotating shaft 410, the driving group 41 can be made to swing the support structure 42, so that the electronic elements 21 can be obliquely disposed on the bearing member 4a relative to the bearing surface 40a.

The electronic device 4 of the present disclosure is designed to swing the support structure 42 by the driving group 41, so as to facilitate the inclination state of the electronic elements 21 to be consistent. Therefore, if the electronic device 2 is used in a light-emitting product (i.e., the electronic element 21 is a light-emitting element such as an LED), the light presented by the electronic device 2 is very uniform.

When using the electronic device 4, taking the electronic element 21 as a light-emitting diode (LED) as an example, as shown in FIG. 4B, the user 9 suffering from Parkinson's disease (PD) adjusts the inclination angle of the circuit board 420 relative to the bearing surface 40a via the rotating shaft 410 of the driving group 41, so that the electronic elements 21 are aligned with the area at the lower back part of the head 90 and next to the neck 91 of the user 9, such that the light L of the electronic elements 21 can be entered into the brain.

Therefore, in the electronic device 4 of the present disclosure, by adjusting the position of the electronic elements 21, the electronic elements 21 are positioned obliquely relative to the bearing surface 40a to facilitate the electronic elements 21 to irradiate the light L toward the brain, so as to stimulate the secretory neurons in the substantia nigra region of the brain to secrete dopamine, thereby improving the physical function of the user 9.

Figure 5A:
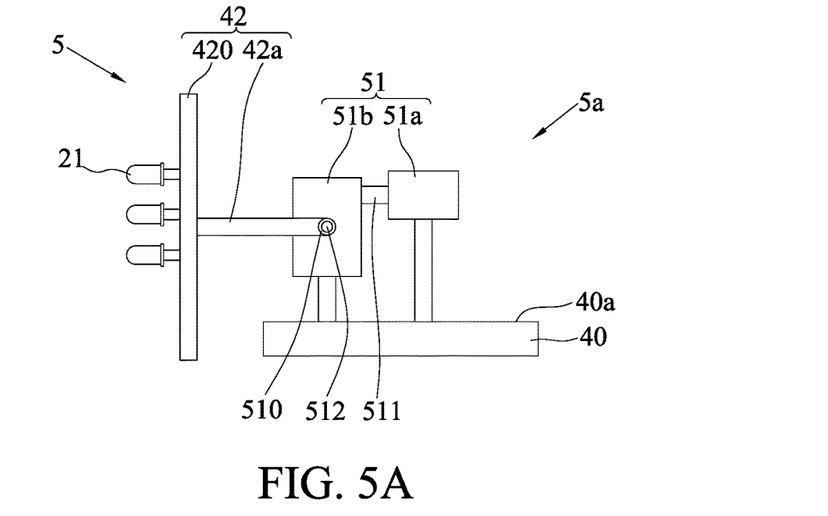
FIG. 5A is a schematic side view of an electronic device according to a third embodiment of the present disclosure.
Figure 5B:
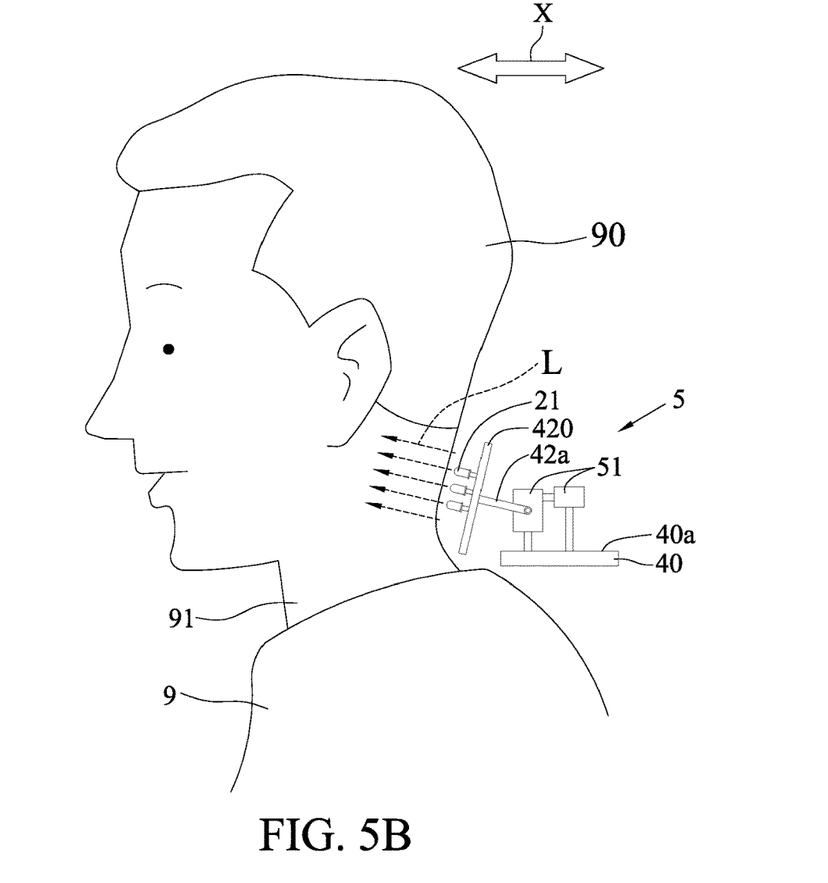
FIG. 5B is a schematic view showing a use state of FIG. 5A.

FIG. 5A and FIG. 5B are schematic views of an electronic device 5 according to a third embodiment of the present disclosure. The difference between the third embodiment and the second embodiment lies in the design of the driving group, so the same points will not be repeated below.

As shown in FIG. 5A and FIG. 5B, a driving group 51 of a bearing member 5a moves the support structure 42 in a biaxial displacement manner.

In an embodiment, the driving group 51 includes a motor 51a, a gear group 51b (such as a deceleration box), a first actuating shaft 511 (i.e., a motor shaft) linked to the motor 51a, a second actuating shaft 512 (i.e., a deceleration output shaft) linked to the gear group 51b, and a rotating shaft 510 linked to the gear group 51b and the bracket 42a, so that the direction in which the motor 51a actuates the first actuating shaft 511 is different from the direction in which the gear group 51b actuates the second actuating shaft 512, such that the driving group 51 can adjust the position of the support structure 42. For example, the direction in which the motor 51a actuates the first actuating shaft 511 is the X-axis direction (i.e., the front and rear directions of approaching or moving away from the human body, as shown in arrow direction X in FIG. 5B), and the direction in which the gear group 51b actuates the second actuating shaft 512 is the Y-axis direction (i.e., the left and right directions of or along the shoulders of the human body). Therefore, the position of the support structure 42 is adjusted by the driving group 51, so that the electronic elements 21 can be aligned with the area at the lower back part of the head 90 of a human body and next to the neck 91 of the human body.

Furthermore, the bracket 42a is fixed at the end of the rotating shaft 510, so that when the motor 51a drives the gear group 51b to rotate the rotating shaft 510, the bracket 42a will rotate together, such that the circuit board 420 rotates together with the electronic elements 21 thereon. Therefore, by adjusting the rotation range of the rotating shaft 510, the driving group 51 can be made to swing the support structure 42, so that the electronic elements 21 are obliquely disposed on the bearing member 4a relative to the bearing surface 40a.

The electronic device 5 of the present disclosure is designed to displace the support structure 42 by the driving group 51, so as to facilitate positioning of the electronic elements 21. Therefore, if the electronic device 2 is used in a light-emitting product (i.e., the electronic element 21 is a light-emitting element such as an LED), the light presented by the electronic device 2 is very uniform.

When using the electronic device 5, taking the electronic element 21 as a light-emitting diode (LED) as an example, as shown in FIG. 5B, the user 9 suffering from Parkinson's disease (PD) adjusts the inclination angle of the circuit board 420 relative to the bearing surface 40a via the rotating shaft 510 of the driving group 51, so that the electronic elements 21 are aligned with the area at the lower back part of the head 90 and next to the neck 91 of the user 9, so that the light L of the electronic elements 21 can be entered into the brain.

Therefore, in the electronic device 5 of the present disclosure, by adjusting the position of the electronic elements 21, the electronic elements 21 are positioned obliquely relative to the bearing surface 40a to facilitate the electronic elements 21 to irradiate the light L toward the brain, so as to stimulate the secretory neurons in the substantia nigra region of the brain to secrete dopamine, thereby improving the physical function of the user 9.

Figure 6:
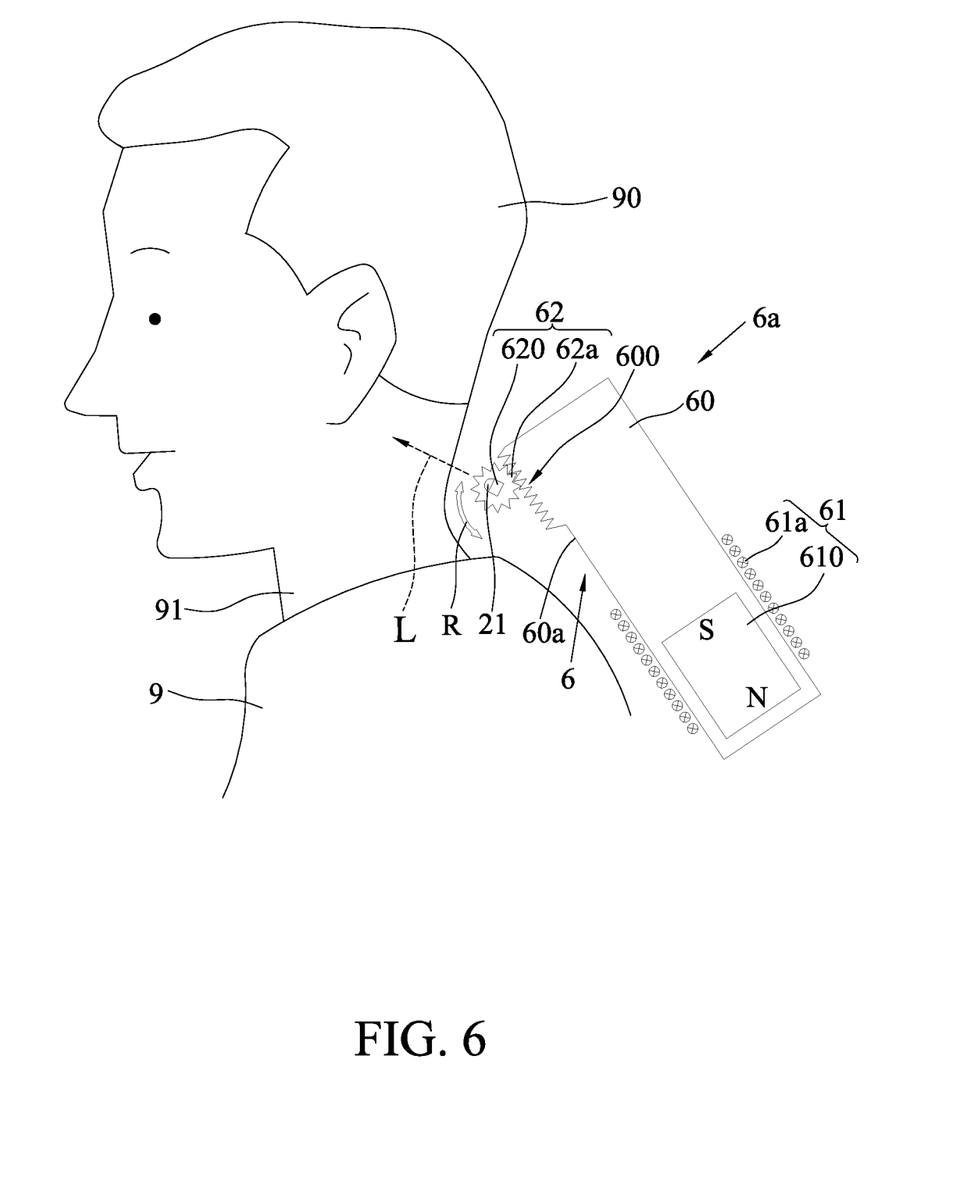
FIG. 6 is a schematic view showing a use state of an electronic device according to a fourth embodiment of the present disclosure.

FIG. 6 is a schematic view of an electronic device 6 according to a fourth embodiment of the present disclosure. The difference between the fourth embodiment and the second embodiment lies in the design of the bearing member, so the same points will not be repeated below.

As shown in FIG. 6, a bearing member 6a includes a base 60, a driving group 61 that drives the base 60 to displace and a support structure 62 disposed on the base 60. One of the surfaces of the base 60 is defined as a bearing surface 60a, and the support structure 62 is disposed on the bearing surface 60a, and the electronic elements 21 are disposed on the support structure 62, wherein the support structure 62 is disposed on the base 60 in a rotatable manner relative to the bearing surface 60a, so that the electronic elements 21 are inclined relative to the bearing surface 60a.

In an embodiment, the base 60 is of a pillar shape, one side of its peripheral surface is used as the bearing surface 60a, and the support structure 62 is engaged with (e.g., cooperates with) the bearing surface 60a of the bearing member 6a in an engaging manner. For example, the support structure 62 includes at least a gear 62a and a circuit board 620 disposed on the gear 62a, and a rack 600 for engaging the gear 62a is formed on the bearing surface 60a.

Furthermore, the driving group 61 displaces the base 60 by electromagnetic induction. For example, the driving group 61 includes a coil group 61a surrounding the outer surface of the base 60 and at least one magnet 610 embedded in the base 60, so that the magnet 610 can sense the coil group 61a to displace the base 60. It should be understood that there are various configurations related to the electromagnetic power, and the present disclosure is not limited to as such.

In addition, in the electronic device 6 of the present disclosure, the support structure 62 is disposed on the base 60 in a manner that can rotate relative to the bearing surface 60a, so that the plurality of electronic elements 21 on the circuit board 620 can be rotated and positioned, thereby making the inclination states of the electronic elements 21 consistent. Therefore, if the electronic device 2 is used in a light-emitting product (i.e., the electronic element 21 is a light-emitting element such as an LED), the light presented by the electronic device 2 is very uniform.

When using the electronic device 6, taking the electronic element 21 as a light-emitting diode (LED) as an example, as shown in FIG. 6, the user 9 suffering from Parkinson's disease (PD) displaces the base 60 by the drive group 61 so that the gear 62a of the support structure 62 rotates (e.g., rotation direction R as shown in FIG. 6) to adjust the inclination angle of the circuit board 620 relative to the bearing surface 40a, such that the electronic elements 21 are aligned with the area at the lower back part of the head 90 and next to the neck 91 of the user 9, so that the light L of the electronic elements 21 can be entered into the brain.

Therefore, in the electronic device 6 of the present disclosure, by adjusting the position of the electronic elements 21, the electronic elements 21 are positioned obliquely relative to the bearing surface 60a to facilitate the electronic elements 21 to irradiate the light L toward the brain, so as to stimulate the secretory neurons in the substantia nigra region of the brain to secrete dopamine, thereby improving the physical function of the user 9.

To sum up, in the electronic device of the present disclosure, the electronic elements are positioned by a variety of ways, so as to make the inclination states of the electronic elements consistent. Therefore, if the electronic device of the present disclosure is applied to a light-emitting product (i.e., the electronic element is a light-emitting element such as an LED), the light it presents will not only illuminate the area accurately and have a very uniform intensity, but also can effectively illuminate the predetermined area (such as the substantia nigra region of the brain).

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. An electronic device for Parkinson's disease, comprising:
   a bearing member including a circuit board and a plurality of guide bases, wherein one surface of the circuit board is defined as a bearing surface, and the plurality of guide bases are made of insulating material and disposed on the bearing surface side by side wherein each of the guide bases has a mounting surface inclined relative to the bearing surface, and wherein the bearing member is formed with a plurality of guide holes that straightly communicate with the circuit board and the guide bases, such that the guide holes are inclined relative to the bearing surface; and
   at least one electronic element disposed on the guide base of the bearing member in an inclined manner relative to the bearing surface, allowing a light of the electronic element to enter a brain of a user suffering from Parkinson's disease from an area at a lower back part of a head and next to a neck of the user, wherein the electronic element has a plurality of electrode pins respectively inserted through the guide holes and directly in contact with a solder of the circuit board, and wherein the electronic element has a positioning portion corresponding to the mounting surface, and the positioning portion abuts against the mounting surface of one of the guide bases and a side surface of another of the guide bases.

2. The electronic device of claim 1, wherein the electronic element is obliquely disposed on the bearing member relative to the bearing surface.

3. The electronic device of claim 2, wherein the electronic element is electrically connected to the circuit board.

4. The electronic device of claim 3, wherein electrode pins further pass through the circuit board, such that the plurality of electrode pins are electrically connected to the electronic element and the bearing member via the solder.

5. The electronic device of claim 1, wherein each of the guide bases is in a shape of a hill or a triangle protruding block, such that at least one inclined surface thereof is used as the mounting surface.

6. The electronic device of claim 1, wherein the plurality of guide holes extend from the mounting surface to the other surface of the circuit board opposite to the bearing surface.

7. The electronic device of claim 1, wherein the electronic element is a light-emitting element.

8. The electronic device of claim 1, further comprising a power source electrically connected to the electronic element.

9. An electronic device for Parkinson's disease comprising:
   a bearing member including a base, a driving group disposed on the base and a support structure disposed on the driving group, wherein one of surfaces of the base is defined as a bearing surface, and the support structure includes at least one circuit board; and
   at least one electronic element disposed on the circuit board of the support structure, wherein the driving group is disposed on the bearing surface, and the driving group drives the support structure to displace, such that the electronic element is inclined relative to the bearing surface, allowing a light of the electronic element to enter a brain of a user suffering from Parkinson's disease from an area at a lower back part of a head and next to a neck of the user, and wherein the electronic element has a plurality of electrode pins directly in contact with the at least one circuit board.

10. The electronic device of claim 9, wherein the driving group includes at least one motor for actuating the support structure.

11. The electronic device of claim 9, wherein the driving group is used for swinging the support structure.

12. The electronic device of claim 9, wherein the driving group moves the support structure in a biaxial displacement manner.

13. The electronic device of claim 9, wherein the driving group is used to displace the circuit board.

14. An electronic device for Parkinson's disease comprising:
   a bearing member including a base and a support structure disposed on the base, wherein one of surfaces of the base is defined as a bearing surface, wherein the support structure is disposed on the bearing surface, and the support structure includes at least a gear and a circuit board disposed on a side surface of the gear, and wherein the gear engages the bearing surface of the bearing member in an engaging manner; and
   at least one electronic element disposed on the circuit board of the support structure, wherein the support structure is disposed on the base in a manner that is rotatable relative to the bearing surface, such that the electronic element is inclined relative to the bearing surface allowing a light of the electronic element to enter a brain of a user suffering from Parkinson's disease from an area at a lower back part of a head and next to a neck of the user, and wherein the electronic element has a plurality of electrode pins directly in contact with the circuit board.

15. The electronic device of claim 14, wherein a rack for engaging the gear is formed on the bearing surface.

16. The electronic device of claim 14, wherein the bearing member further includes a driving group for driving the base to displace.

17. The electronic device of claim 16, wherein the driving group displaces the base by electromagnetic induction.

18. The electronic device of claim 17, wherein the driving group includes a coil group surrounding the surfaces of the base and at least one magnet embedded in the base, and wherein the magnet induces the coil group to displace the base.

* * * * *